United States Patent [19] [11] 4,194,200
Goldie [45] Mar. 18, 1980

[54] COMBINED RECEIVER PROTECTOR, AGC ATTENUATOR AND SENSITIVITY TIME CONTROL DEVICE

[75] Inventor: Harry Goldie, Randallstown, Md.

[73] Assignee: The United States of America as represented by the Secretary of the Air Force, Washington, D.C.

[21] Appl. No.: 956,704

[22] Filed: Nov. 1, 1978

Related U.S. Application Data

[63] Continuation-in-part of Ser. No. 801,714, May 31, 1977, abandoned.

[51] Int. Cl.² .............................................. G01S 7/34
[52] U.S. Cl. .............................. 343/5 SM; 343/7 AG; 333/13
[58] Field of Search ........... 333/13; 343/5 SM, 7 AG

[56] References Cited

U.S. PATENT DOCUMENTS

| 2,984,741 | 5/1961 | Bronstein et al. ............ 343/5 SM X |
| 3,588,894 | 6/1971 | Prickett ............................. 343/7 AG |
| 3,725,913 | 4/1973 | Roehl et al. ..................... 343/5 SM |
| 3,949,398 | 4/1976 | Donahue ..................... 343/5 SM X |
| 4,027,255 | 5/1977 | Blakeney ............................... 333/13 |

Primary Examiner—T. H. Tubbesing
Attorney, Agent, or Firm—Joseph E. Rusz; Willard R. Matthews

[57] ABSTRACT

The passive receiver protector, AGC attenuator and sensitivity time control functions of a radar are combined in a single device which performs the functions in front of the radar low noise amplifier with relatively low loss. The receiver protector utilizes semiconductor diodes which operate as a power limiter during transmit and as precision attenuators during receive.

9 Claims, 6 Drawing Figures

COMBINED RECEIVER PROTECTOR, AGC ATTENUATOR AND SENSITIVITY TIME CONTROL DEVICE

STATEMENT OF GOVERNMENT INTEREST

The invention described herein may be manufactured and used by or for the Government for governmental purposes without the payment of any royalty thereon.

This is a continuation-in-part of co-pending patent application Ser. No. 801,714 entitled *A COMBINED PROTECTOR, AGC ATTENUATOR AND SENSITIVITY TIME CONTROL DEVICE*, filed by Harry Goldie May 31, 1977 (now abandoned).

BACKGROUND OF THE INVENTION

Present day radars use physically separate microwave devices to perform the receiver protecting function, the automatic gain function, and the sensitivity time control function. Receiver protecting is commonly accomplished by a device which functions as a high power limiter during the time when the radar is transmitting high power bursts. It prevents the power reflected toward the receiver from the radar antenna from burning out the receiver. When the transmitter burst ceases, the radar waits for the weak return echo from the target. This weak echo is received by the antenna and passes thru the TRLL (transmit-receive-tube-limiter-limiter function). The TRLL may be alternately thought of as an RP (receiver protector) which is newer and more descriptive terminology. Structurally it usually includes a plasma high power stage and a diode low power stage. The weak microwave echo may be acted upon by various system functions such as STC (sensitivity time control) or AGC (automatic gain control).

As aforementioned, receiver protector (RP), automatic gain control (AGC) and sensitivity time control (STC) functions have always been performed by separate physical components. It is the purpose of this invention to uniquely combine their functions into one physical component in such a manner as to significantly reduce the RF insertion loss. This loss directly contributes to receiver degradation, and its minimization is critical to overall system noise figure since it is located before the radar mixer and/or LNA (low noise microwave amplifier). The TRL (transmit receive limiter) is used as the receiver protector and the STC is used to program receiver gain so that it is low for targets at close range and high for targets at long range. The AGC is required to provide constant gain independent of received signal strength.

SUMMARY OF THE INVENTION

The invention utilizes the low power portion to the radar TRLL which contains microwave semiconductor diodes to perform the dual function of high power limiting during transmit and low power precision attenuation during receive. The radar system STC and AGC command signals (and/or other system function command signals) are linearized and summed. A video driver circuit responsive to the summed signal biases the semiconductor diodes to effect appropriate attenuation and automatic gain control (or other system function control) of the received signals.

It is a principal object of the invention to provide a radar having a new and improved combined receiver protector, AGC and sensitivity time control device.

It is another object of the invention to provide a radar system having significantly reduced RF insertion loss.

It is another object of the invention to provide a radar wherein the receiver protector performs the dual function of high power limiting and low power precision attenuation.

These together with other objects features and advantages of the invention will become more readily apparent from the following detailed description when taken in conjunction with the illustrative embodiment in the accompanying drawings.

DETAILED DESCRIPTION OF THE PREFERRED EMBODIMENT

Figure 1A:
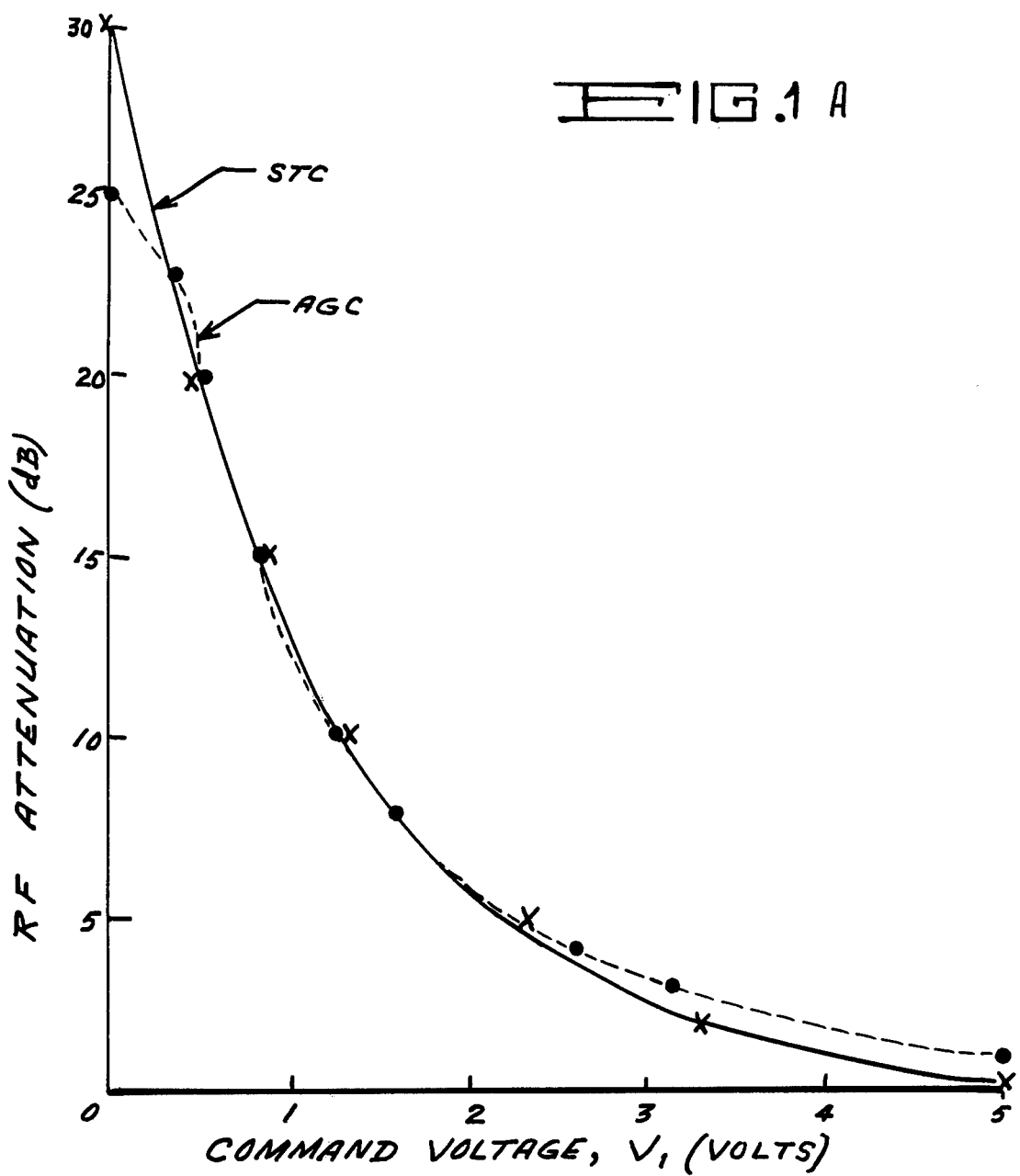
FIG. 1a is a plot of data of the command voltage, $V_1$, against RF attenuation.
Figure 1B:
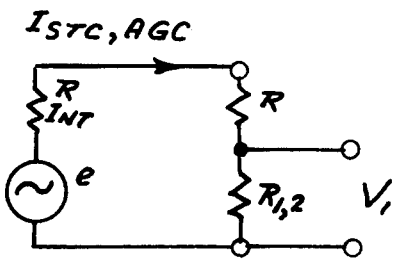
FIG. 1b shows a simplified circuit diagram for obtaining $V_1$.

Assume that the desired data for the radar is that of FIG. 1a. The c, I and $V_1$ columns of Table I is a tabulation of the STC and AGC curves of FIG. 1a.

TABLE I
DESIGN VALUES OF COMMAND SIGNAL VOLTAGES FOR STC AND AGC FUNCTIONS

| A. AGC FUNCTIONS R - 312 OHMS | | | | | B. STC FUNCTIONS R - 31.2 OHMS | | | | |
|---|---|---|---|---|---|---|---|---|---|
| c (dB) | I (mA) | $V_1$ (v) | $V_2$ (v) | $V_3$ (v) | c (dB) | I (mA) | $V_1$ (v) | $V_2$ (v) | $V_3$ (v) |
| 25 | 0 | 0 | 5.0 | 5.0 | 30 | 0 | 0 | 5.0 | 5.0 |
| 23 | 1 | .31 | 4.69 | 4.6 | 23 | | .38 | 4.72 | 3.83 |
| 20 | | .50 | 5.50 | 4 | 20 | 14 | .44 | 4.56 | 3.33 |
| 15 | | .82 | 4.18 | 3 | 15 | 26 | .82 | 4.18 | 2.5 |
| 10 | | 1.25 | 3.75 | 2 | 10 | 42 | 1.31 | 3.69 | 1.66 |
| 8 | 5 | 1.56 | 3.44 | 1.6 | 8 | | 1.50 | 3.50 | 1.33 |
| 5 | | 2.28 | 2.72 | 1 | 5 | 73 | 2.28 | 2.72 | .83 |
| 3 | 10 | 3.13 | 1.87 | 0.6 | 3 | | 3.00 | 2.00 | .50 |
| 2 | | 3.88 | 1.12 | 0.4 | 2 | 106 | 3.31 | 1.69 | .33 |
| 1 | 16 | 5.00 | 0 | 0 | 0.5 | 160 | 5.00 | 0 | 0 |

$V_3$ assumes m = 5 dB/volt    $V_3$ assumes m = 6 dB/volts

Each current is passed through a simple voltage divider to normalize the command voltage to 5 volts as shown in Table I. The shape of the two curves need not be the same but any similarity between the AGC and STC functions tends to provide common channel design in the function compensators.

Figure 2:
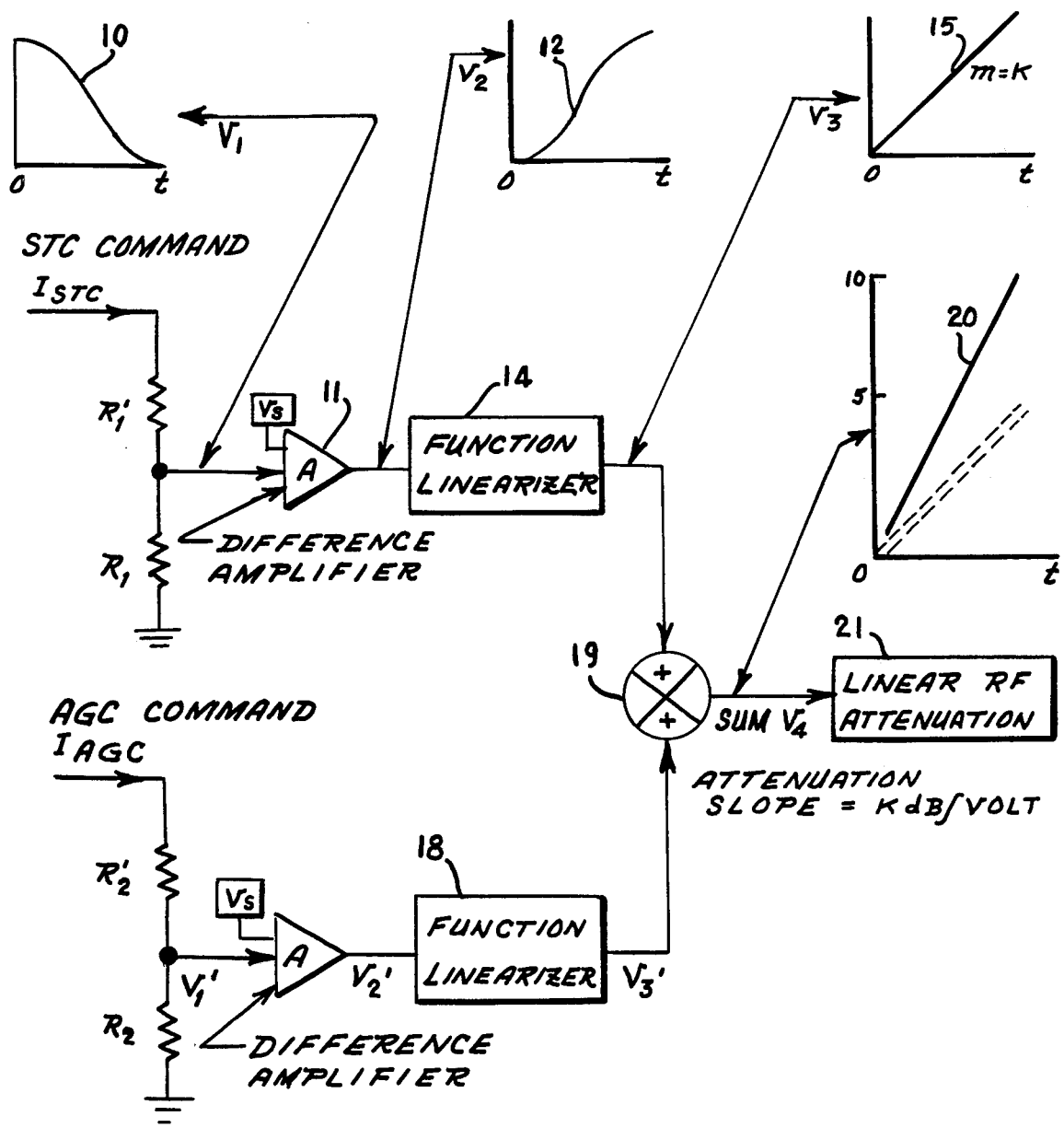
FIG. 2 illustrates a block diagram of portions of the TRLL circuit comprehended by the invention with independent AGC and STC linearizers resulting in superimposed STC function on AGC function.
Figure 3:
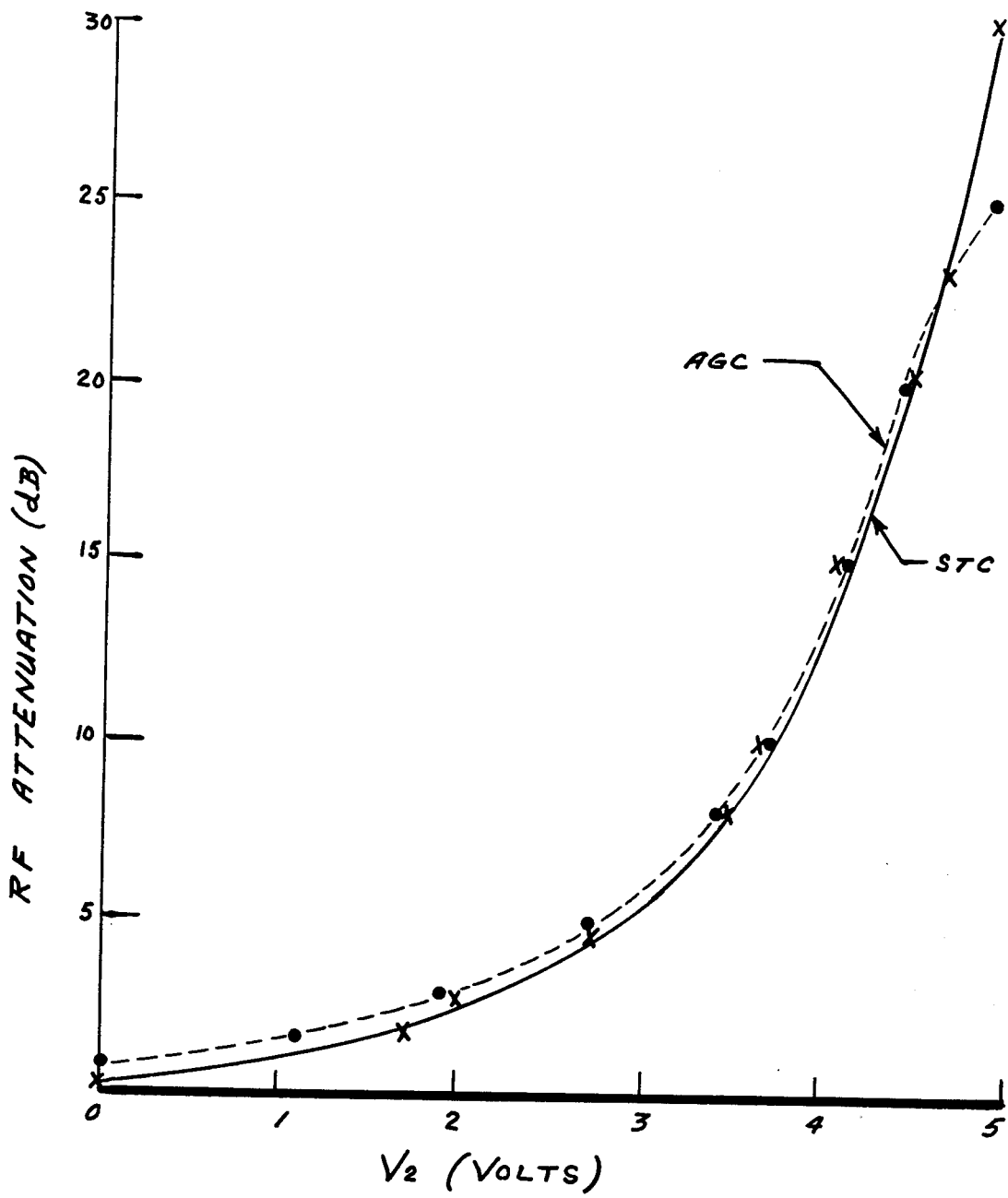
FIG. 3 illustrates the STC and AGC functions after passing through the difference amplifier.
Figure 4:
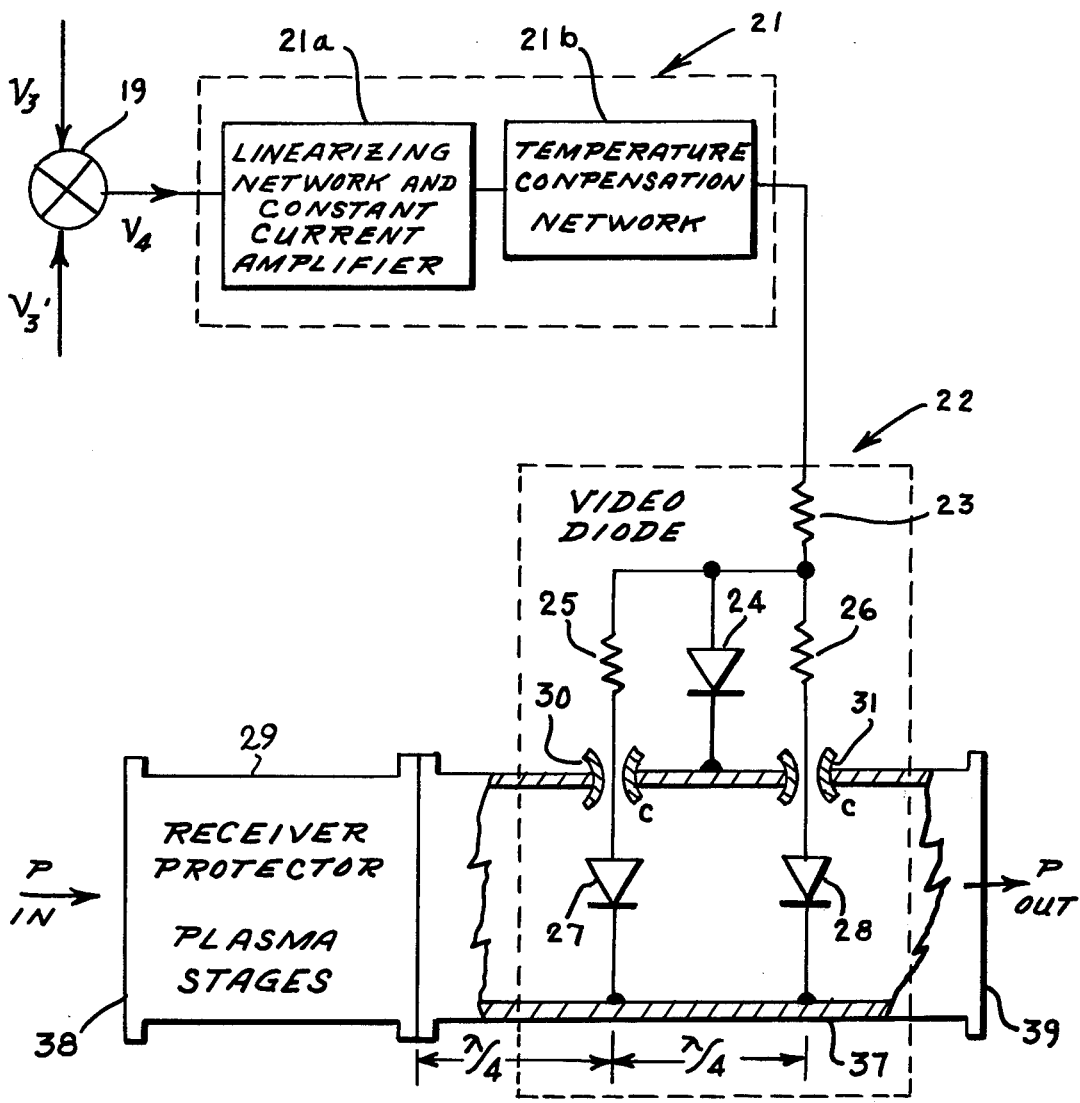
FIG. 4 shows a detailed diagram of dual function TRLL comprehended by the invention showing retention of passive receiver protection.

The overall video driver design is shown in FIGS. 2 and 4. STC command voltage is passed through a voltage divider of resistors $R'_1$ and $R_1$. STC command voltage $V_1$ shown as curve 10 is passed through difference amplifier 11 so that the output function is compatible with the input circuitry of function linearizer 14. The conventional function linearizer is composed of a series of biased video diodes which require an increasing $V_2$ vs time as shown by curve 12 of FIG. 2. Thus to have $V_1$ compatible with function linearizer 14, it is necessary to invert the abcissa. Thus zero command voltage corresponds to maximum RF attenuation with the diodes heavily biased. $K_1$ for the illustrative example of Table I is 5.5 dB/volt. FIG. 3 shows the RF attenuation function when the difference amplifier is used. Waveform 12 is $V_2$ and is the output from difference amplifier 11. Transfer function linearizer 14 is used to linearize to STC signal as shown by the $V_3$ curve 15 of FIG. 2.

The AGC command signal is also passed through voltage divider of resistors $R'_2$ and $R_2$ to difference amplifier 16 to transfer function linearizer 18 for the identical purposes as for the STC command signal.

It is now possible to add the AGC and STC command signals in sum circuit 19 to obtain the sum $V_4$ shown as curve 20 in FIG. 2.

The output of the sum circuit covers a range of 0 to 10 volts and is a linear function of time as shown. Microwave linear RF attenuator 21 has its own compensation circuit and is a linear device yielding $K_1$ dB/volt for the maximum of 10 volts.

FIG. 4 shows the details of the microwave attenuator and compensator. There is shown sum circuit 19 of FIG. 2 having output $V_4$. Component 21 also shown in FIG. 2 is comprised of linearizing network and constant current amplifier 21a in series with temperature compensation network 21b. The output of component 21 is fed to component 22 which includes resistor 23, video diode 24, resistors 25 and 26, RF re-entrant chokes 30 and 31 and microwave semiconductor diodes 27, 28 which can be PIN diodes or Varactors or the like. The receiver protector includes plasma stages 29 for high power and coupled thereto, waveguide section 37 which contains the low power diodes 27, 28. The device also has an input port 38 and an output port 39. The output power, P, is available at output port 38. The semiconductor diodes have quarter wavelength spacing as shown and the first diode 27 is also spaced a quarter wavelength from plasma stages 29. The video driver of FIGS. 2 and 4 accepts $V_4$ as noted above and rectifies the transfer characteristics in order to compensate for the non-linearities of diodes 27, 28. This is a break point circuit (21a) which is conventional. The temperature compensation network (21b) is also a conventional network which compensates for the temperature sensitivity of diodes 27, 28. The video diode 24 allows the charge built up on diodes 27, 28 to discharge after the high power radar transmitter ceases. It provides faster "recovery time" but is not critical to the operation of the device.

Video diode 24 shown above varactors 27 and 28 allows a self-bias DC current to flow when RF power is incident at input port 38, when external bias is zero. In this way, the passive feature of the TRLL is maintained.

Figure 5:
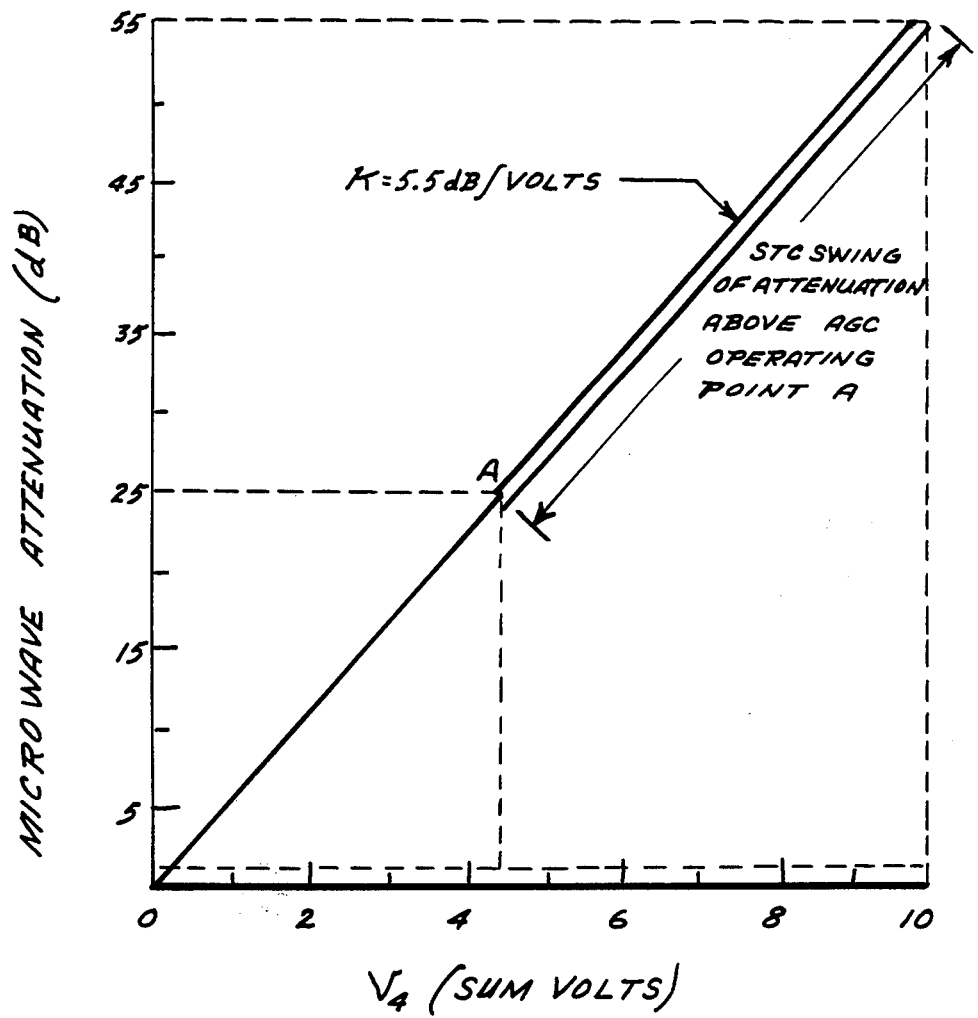
FIG. 5 illustrates the minimum and maximum attenuation points of the STC swing controlled by the AGC operating point A assuming a triple diode with 55 dB maximum attenuation.

FIG. 5 shows the overall circuit transfer function with the STC swing of attenuation superimposed on an operating point controlled by the AGC command signal. The illustrative example of FIG. 5 shows the Table I values of full 30 dB STC swing above the DC operating point of AGC bias. The AGC is set at the maximum bias of 25 dB at point A.

The important parameter relevant to providing AGC and STC functions in the diode limiter is to obtain high RF attenuation while simultaneously retaining self-limiting. Data from laboratory tests on X-band single diode switches has demonstrated an isolation/insertion ratio of approximately 21 dB/0.2 dB so that two quarter wavelength cascaded stages would yield 42 dB maximum RF attenuation. The 21 dB refers to the "on" biased microwave frequency isolation for high level STC (sensitivity time control) or AGC (automatic gain control). The 0.2 dB refers to the excellent low loss characteristics when the attenuator is in the "off" position. It must be recalled that this device will be used in front of low noise receivers in radar systems and that lowest loss (under 1 dB) must be attained if the invention is to be practical. If attenuation greater than 42 dB is required to satisfy both STC and AGC functions, a third diode could be added. Because the invention uses separate function compensation for STC and AGC the maximum attenuation for each function need not be equal. Thus the STC may have 23 dB and AGC may have 19 dB maximum loss, or vice versa.

Receiver protector, AGC and sensitivity time control functions have always been performed by separate physical components. It is the purpose of this invention to uniquely combine their functions into one physical component in such a manner as to significantly reduce the RF insertion loss. This loss directly contributes to receiver noise figure degradation, and its minimization is critical to overall system noise figure since it is located before the mixer and/or LNA (low noise microwave amplifier). The TRL is used as the receiver protector and the STC is used to program receiver gain so that it is low for targets at close range and high for targets at long range. The AGC is required to provide constant gain independent of received signal strength.

Other than the method outlined above to achieve the combined TRL/STC/AGC function, there may be used the combination in a single semiconductor diode of the limiting function in a receiver protector with the STC and AGC or other programmed attenuation function using variations on the video circuitry that are obvious to one versed in the state-of-the-art. While a rectangular waveguide type implementation has been described, it is apparent that other microwave transmission line types such as coaxial, line, stripline, or microstrip may be used with appropriate changes in the geometries. The invention also comprehends other functions such as operation of one or more of the diodes as a noise source can be included in addition to the AGC or STC, controlled attenuator and limiting functions. Accordingly, while the invention has been described in its preferred embodiment it is understood that the words which have been used are words of description rather than words of limiation and that changes within the purview of the appended claims may be made without departing from the scope and spirit of the invention in its broader aspects.

What is claimed is:

1. In combination with a radar having various discrete system function command signals, a combined radar receiver protector and system function command signal implementing device comprising
   a high power plasma stage,
   a transmission line section connected thereto having microwave semiconductor diode means connected thereacross,
   system function command signal linearizing means, and
   a video driver circuit connected to receive linearized system function command signals and bias said microwave semiconductor diode means in response thereto.

2. A combined radar receiver protector and system function command signal implementing device as defined in claim 1 wherein said system function command signal linearizing means comprises a plurality of separate linearizing circuits each connected to receive a discrete system function command signal, and summing means for summing the outputs thereof, the output of said summing means feeding said video drive circuit.

3. A combined radar receiver protector and system function command signal implementing device as defined in claim 2 including a break point circuit and a temperature compensation network connected in series between the output of said summing means and said video drive circuit and being adapted to compensate for non-linearities and temperature sensitivity in said microwave semiconductor diode means.

4. A combined radar receiver protector and system function command signal implementing device as defined in claim 3 wherein said microwave semiconductor diode means comprises at least one semiconductor diode, diode spacing being at quarter wavelength intervals.

5. A combined radar receiver protector and system function command signal implementing device as defined in claim 4 wherein said semiconductor diodes are varactors.

6. A combined radar receiver protector and system function command signal implementing device as defined in claim 4 wherein said semiconductor diodes are PIN diodes.

7. A combined radar receiver protector and system function command signal implementing device as defined in claim 4 wherein said video drive circuit includes first and second resistors connected in series between said temperature compensation network and a first semiconductor diode, a third resistor connected between the junction of said first and second resistors and a second semiconductor diode, an r.f. video diode connected between the junction of said first and second resistors and said transmission line section, a first re-entrant choke between said second resistor and said first semiconductor diode, and a second re-entrant choke between said third resistor and said second semiconductor diode.

8. A combined radar receiver protector and system function command signal implementing device as defined in claim 7 wherein said transmission line section is rectangular waveguide.

9. A combined radar receiver protector and system function command signal implementing device as defined in claim 7 wherein said transmission line section is coaxial line.

* * * * *